United States Patent
Si et al.

(10) Patent No.: US 7,672,417 B2
(45) Date of Patent: Mar. 2, 2010

(54) CLOCK AND DATA RECOVERY

(75) Inventors: Xiaomin Si, San Jose, CA (US); Larry Wu, Shanghai (CN)

(73) Assignee: Montage Technology Group Limited, George Town, Grand Cayman (KY)

( * ) Notice: Subject to any disclaimer, the term of this patent is extended or adjusted under 35 U.S.C. 154(b) by 769 days.

(21) Appl. No.: 11/468,787

(22) Filed: Aug. 31, 2006

(65) Prior Publication Data

US 2008/0056426 A1 Mar. 6, 2008

(51) Int. Cl.
*H03D 3/24* (2006.01)
*H04L 7/00* (2006.01)

(52) U.S. Cl. ...................... 375/375; 375/354

(58) Field of Classification Search .......... 375/373, 375/376, 355, 375, 371, 354; 327/2, 12, 327/165, 262, 256, 205; 331/25, 34, 57, 331/177
See application file for complete search history.

(56) References Cited

U.S. PATENT DOCUMENTS 4,417,348 A * 11/1983 Abbruscato ............... 375/267
7,391,251 B1 * 6/2008 Zhang et al. ............... 327/261
2005/0281193 A1 * 12/2005 Hofmeister et al. ......... 370/217

OTHER PUBLICATIONS

Stefanos Sidiropoulos, etc., "A Semidigital Dual Delay-Locked Loop", IEEE Journal of Solid-State Circuits, vol. 32, No. 11, Nov. 1997.
Thomas H. Lee, etc., "A 2.5 V CMOS Delay-Locked Loop for an 18 Mbit, 500 Megabyte/s DRAM", IEEE Journal of Solid-State Circuits, vol. 29, No. 12, Dec. 1994.
Jeffrey Yen, Michael G. Case, etc., "A Fully Integrated 43.2Gb/s Clock and Data Recovery and 1:4 DEMUX IC in InP HBT Technology", ISSCC 2003 / Session 13 / 40Gb/s Communication ICs / Paper 13.6.

* cited by examiner

*Primary Examiner*—Khai Tran
(74) *Attorney, Agent, or Firm*—Ivy Y Mei

(57) ABSTRACT

A data and clock recovery circuit having a retimer mode and a resync mode. In one embodiment, a receiver circuit includes; a retimer; a clock recovery circuit to provide a clock signal to the retimer; and an adjustable delay to provide a delayed version of an input signal to the retimer. When in a resync mode, the adjustable delay causes a pre-selected delay in the input signal and the clock recovery circuit dynamically selects a clock phase to generate the clock signal. When in a second mode, the adjustable delay dynamically adjusts the delayed version of the input signal and the clock recovery circuit outputs the clock signal having a pre-selected clock phase.

19 Claims, 6 Drawing Sheets

CLOCK AND DATA RECOVERY

FIELD OF THE TECHNOLOGY

At least some embodiments of the invention relate to receiver circuitry in general, and more specifically but not exclusively to clock and data recovery circuitry.

BACKGROUND

In data communication systems, data can be sent from a transmitter with or without an assisting clock. In the receiver, a conventional Clock Data Recovery (CDR) makes use of a Delay-Locked Loop (DLL) or a Phase-Locked Loop (PLL) to recover data and clock from the input data. Depending on its loop dynamics, a convectional Clock Data Recovery (CDR) can transfer more or less input jitter to output.

A conventional CDR may have a delay saturation problem. Delay saturation occurs when extremes of the delay chain in the Delay-Locked Loop (DLL), or in the Phase-Locked Loop (PLL), has been reached. When the delay of a controlled delay path reaches the maximum, delay saturation occurs. A conventional CDR system, such as a delay locked loop based system, usually utilizes a clock phase interpolator and/or phase selection schemes to avoid saturation or limit the range of delay control by moving the clock or choosing a clock phase. See, for example, S. Sidiropoulos and M. Horowitz, "A semidigital dual delay-locked loop," IEEE J. Solid-State Circuits, vol. 32, no. 11, pp. 1683-1692, November 1997.

In some applications, however, the phase of the master clock (also known as a local clock) is preferred to be fixed. In such applications, the local master clock cannot be moved. If a conventional scheme of selecting or interpolating the clock to re-time the data were used, an extra stage might be needed to re-time the recovered data using the local master clock. The data can be retimed to generate output with reduced jitter. However, the additional re-time stage increases the power consumption and latency.

For example, in one conventional CDR scheme that uses a delay/phase locked loop to recover clock and data, multi-phase clocks are generated from a delay chain and used in a multiplexer/interpolator to generate a clock signal for a retimer, which generates a data output from a data input. A phase detector/controller is used to control the multiplexer/interpolator based on the data output. In such a scheme, there is a trade-off between jitter tolerance and jitter transfer. For example, if the bandwidth of the CDR loop is low, the jitter tolerance suffers; if the bandwidth of the CDR loop is high, the performance in jitter transfer suffers.

Another conventional scheme is based on the above discussed conventional CDR scheme. A so called clean-up PLL takes the clock signal generated multiplexer/interpolator to generate a cleaner clock for a further retimer, which takes the output of the previous retimer to generate the data output. The clean-up PLL can have a smaller bandwidth than that of the CDR loop in front of it and thus generate output data with less jitter. In such a scheme, a first stage retimer with a high loop bandwidth is used for improved jitter tolerance; and a second stage with a low loop bandwidth is used to improve the performance in jitter transfer. Such a scheme has been used in repeaters of data communication systems. Disadvantages of such a scheme include higher power consumption and higher latency.

Still another conventional scheme, often used in applications where the local clock has the same or similar frequency as that of the input data, makes use of a First-In-First-Out (FIFO) buffer to align phase and frequency of the input data with that of the local clock. Such a scheme increases the latency of the data from input to output; and systems using such a scheme may need to be re-calibrated when the input data stream has a varying delay relative to the local master clock. See, for example, Min Xu, Saied Benyamin, Xiaomin Si, et al, "An SFI-5 Compliant 16:4 Multiplexer for OC-768 Systems", ISSCC 2003/SESSION 13/40 Gb/s COMMUNICATION ICS/PAPER 13. 5.

SUMMARY OF THE DESCRIPTION

A data and clock recovery circuit having a retimer mode and a resync mode is described herein. Some embodiments of the invention are summarized in this section.

A receiver circuit includes a retimer; a clock recovery circuit to provide a clock signal to the retimer; and an adjustable delay to provide a delayed version of an input signal to the retimer. When in a first mode, the adjustable delay causes a pre-selected delay in the input signal and the clock recovery circuit dynamically selects a clock phase to generate the clock signal. When in a second mode, the adjustable delay dynamically adjusts the delayed version of the input signal and the clock recovery circuit outputs the clock signal having a pre-selected clock phase.

The circuit further includes a control circuit coupled to the clock recovery circuit and the adjustable delay to switch between the first mode and the second mode.

When the control circuit provides a signal to switch from the first mode to the second mode, a current clock phase in the first mode is selected as the pre-selected clock phase in the second mode. When the control circuit provides a signal to switch from the second mode to the first mode, a pre-determined constant delay is selected as the pre-selected delay in the first mode. When the control circuit provides a signal to switch from the second mode to the first mode, a current delay in the second mode is selected as the pre-selected delay in the first mode.

The circuit further includes a phase detector coupled to an output of the retimer; wherein the clock recovery circuit and an adjustable delay receive an output of the phase detector as input; wherein the phase detector comprises an Alexander phase detector.

In the receiver circuit the clock recovery circuit includes a loop to generate multiple clocks from a reference clock; a state machine coupled to the phase detector to determine a control signal from the output of the phase detector; and a multiplexer coupled to the state machine and the loop to select the clock signal from the multiple clock according to control signal. The loop includes a phase lock loop or a delay look loop.

The clock recovery circuit includes a loop to generate multiple clocks from a reference clock; a state machine coupled to the phase detector to determine a control signal from the output of the phase detector; and an interpolator coupled to the state machine and the loop to generate the clock signal from the multiple clocks according to control signal. When switching to the second mode, the state machine is switched to maintain a current state regardless of the output of the phase detector. The adjustable delay is further controlled according to an output of the loop. The retimer includes a flip-flop.

A receiver circuit having a first mode and a second mode, the circuit includes a retimer; a clock recovery circuit to provide a clock signal to the retimer, wherein when in the first mode a phase of the clock signal is adjusted according to an output of the retimer and when switching from the first mode to the second mode a current phase of the clock signal determined in the first mode is maintained and not changed in the second mode; and an adjustable delay to provide a delayed version of an input signal to the retimer. When in the second mode, the adjustable delay is adjusted according to the output of the retimer; and when in the first mode, the adjustable delay is not adjusted according to the output of the retimer. The circuit further includes a phase detector coupled to the clock recovery circuit and the adjustable delay; wherein the clock recovery circuit is at least controlled by an output of the phase detector in the second mode; and the adjustable delay is at least controlled by the output of the phase detector in the first mode.

A receiver circuit includes a mode control to provide a first control signal for a first mode and a second signal for a second mode; a retimer; a phase detector coupled to an output of the retimer; a clock recovery circuit coupled to the mode control to provide a clock signal to the retimer, wherein when in the first mode the clock signal is adjusted according to an output of the phase detector and when in the second mode the clock signal is not adjusted; an adjustable delay to generate a delayed version of an input signal; and a multiplexer coupled to the mode control to provide the delay version of the input signal to the retimer in the second mode and provide the input signal to the retimer in the first mode.

In the receiver circuit, the clock recovery circuit includes a locked loop comprising a delay chain to generate multiple clocks from a reference clock; a multiplexer coupled to the mode control; a counter coupled to multiplexer to generate a control signal from the output of the phase detector in the first mode and maintain the control signal in the second mode; and a circuit coupled to the counter and the loop to output the clock signal based on the multiple clock according to control signal from the counter.

The present invention includes methods and apparatuses which perform these methods, including data processing systems which perform these methods, and computer readable media which when executed on data processing systems cause the systems to perform these methods.

Other features of the present invention will be apparent from the accompanying drawings and from the detailed description which follows.

BRIEF DESCRIPTION OF THE DRAWINGS

The present invention is illustrated by way of example and not limitation in the figures of the accompanying drawings in which like references indicate similar elements.

DETAILED DESCRIPTION OF THE INVENTION

The following description and drawings are illustrative of the invention and are not to be construed as limiting the invention. Numerous specific details are described to provide a thorough understanding of the present invention. However, in certain instances, well known or conventional details are not described in order to avoid obscuring the description of the present invention. References to one or an embodiment in the present disclosure are not necessarily references to the same embodiment; and, such references mean at least one.

One embodiment of the invention uses two Clock and Data Recovery (CDR) loops to provide a synchronization circuit that has low latency and lower jitter. The circuit can be switched between the two CDR loops to synchronize or re-transmit a data stream with reduced latency, jitter and/or power consumption. In one embodiment, a simple structure can be used to implement a data recovery/delivery/synchronization system with reduce latency, jitter and/or power consumption.

Figure 1:
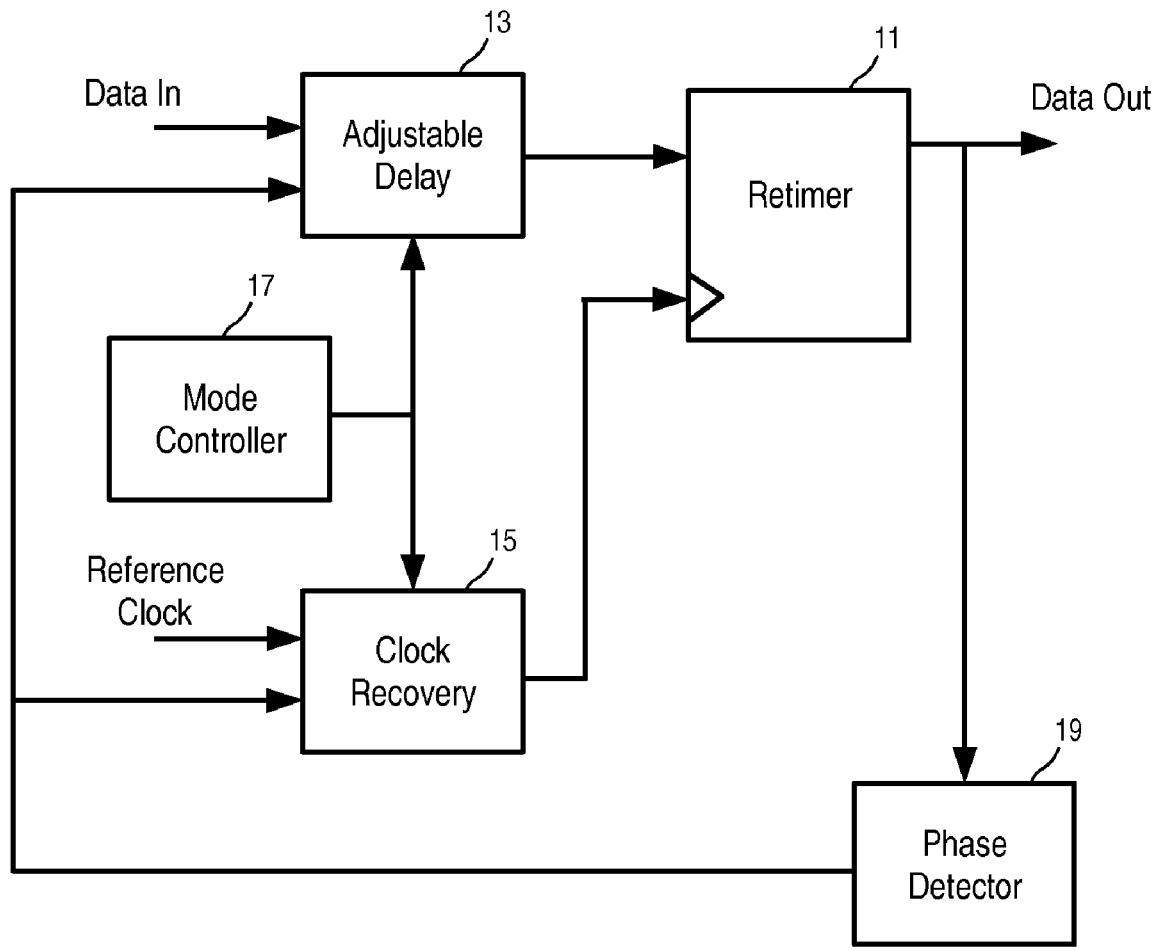
FIG. 1 illustrates a clock and data recovery circuitry according to one embodiment of the invention.

FIG. 1 illustrates a clock and data recovery circuitry according to one embodiment of the invention. As shown in FIG. 1, the data synchronization scheme includes two CDR loops. In one embodiment, a mode controller 17 is used to select between a resync mode and a retime mode.

When in the resync mode, a first loop, including the clock recovery 15, the retimer 11 and the phase detector 19, is active. When the first loop is active, the output of the phase detector 19 adaptively adjusts the local master clock, via the clock recovery 15, to cause the retime 11 to sample the input data according to the actively adjusted local master clock. In one embodiment, when in the resync mode, the adjustable delay causes a constant delay to the input data; and the adjustable delay is not actively adjusted according to the output of the phase detector 19.

When in the retime mode, a second loop, including the adjustable delay 13, the retimer 11 and the phase detector 19, is active. When the second loop is active, the output of the phase detector 19 adaptively controls the delay of the input data, via the adjustable delay 13, such that the retimer generates the output data that is aligned with the local master clock. In one embodiment, when in the retime mode, the clock recovery 15 generates a local master clock from the reference clock; and the local master clock is not actively adjusted according to the output of the phase detector 19.

Thus, in one embodiment, when in the resync mode, the circuitry has low latency. When in the retime mode, the circuitry has low jitter.

In one embodiment, a circuitry can incrementally transition from a resync mode to a retime mode. For example, the mode control 17 can provide a weight factor, which can incrementally change the adjustable delay 13 from fully active to fully inactive while changing the clock recovery 15 from fully inactive to fully active. For example, the model control 17 may weight the output in opposite directions for the adjustable delay 13 and the clock recovery 15 to allow the circuit to operate in an intermediate mode.

In FIG. 1, the first loop and the second loop share the phase detector 19, which in one embodiment is an Alexander type phase detector. Alternatively, the first and second loops may not share the phase detector. Further, in another embodiment, the adjustable delay may not be controlled by the output of a phase detector connected to the output of the retimer; instead, the output of a phase detector connected to the output of the adjustable delay 13 can be used to control the adjustable delay 13 and form the second loop for the retime mode.

In one embodiment, an Alexander type phase detector is used to generate an output according to the output data from the retimer 11 in the resync mode to control the clock recovery 15; and another phase detector is used to compare the local master clock from the output of the clock recovery 15 and the output data from the retimer 11 in the retime mode to control the adjustable delay 13. In one embodiment, the phase detectors share at least a portion of circuitry.

Figure 2:
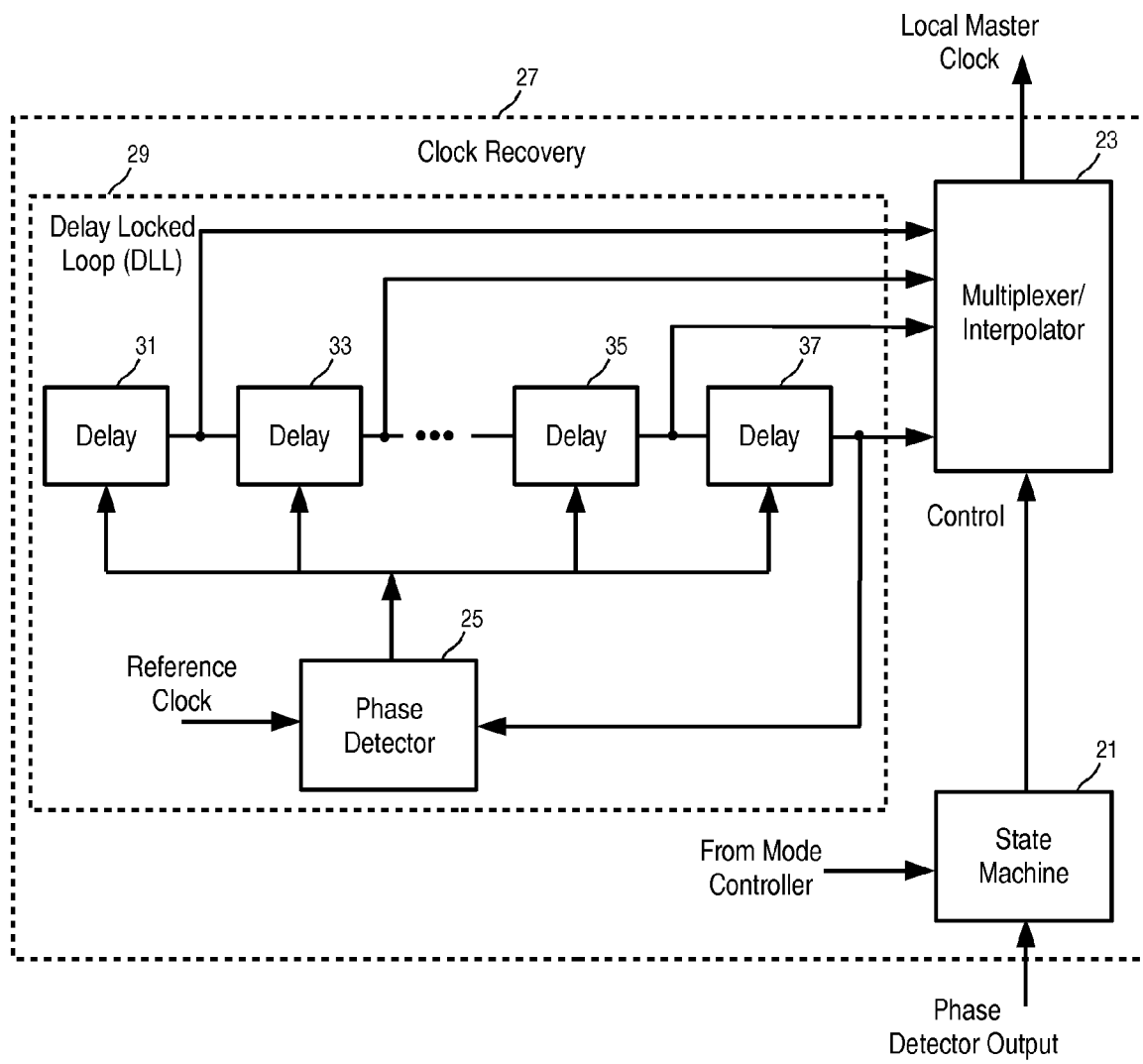
FIG. 2 illustrates an example of a clock recovery portion of a receiver according to one embodiment of the invention.

FIG. 2 illustrates an example of a clock recovery portion of a receiver according to one embodiment of the invention. In FIG. 2, the clock recovery 27 includes a Delay Locked Loop (DLL) 29, a multiplexer/interpolator 23 and a state machine 21. The clock recovery 27 can be an implementation of the clock recovery 15 in FIG. 1.

In the Delay Locked Loop (DLL) 29, a delay chain, including adjustable delays 31, 33, . . . , 35 and 37, generates multiple clocks that correspond to different delays/phases of the reference clock. The adjustable delays 31, 33, . . . , 35 and 37 are controlled by the phase detector 25 to form a Delay Locked Loop (DLL) 29.

In FIG. 2, the multiple clocks generated from the Delay Locked Loop (DLL) 29 is provided as the inputs to the multiplexer/interpolator 23. A control signal causes the multiplexer/interpolator 23 to generate the local master clock.

In FIG. 2, the control signal for the multiplexer/interpolator 23 is generated by the state machine 21, which is controllable by the mode controller. For example, when in the resync mode, the state machine 21 is switched on to actively adjust the state according to the output of the phase detector (e.g., the phase detector 19 in FIG. 1). When in the retime mode, the state machine 21 is switched to maintain the current state and ignore the input from the phase detector (e.g., the phase detector 19 in FIG. 1). Thus, when in the resync mode, the multiplexer/interpolator 23 actively adjusts the local master clock according to the output of the phase detector (e.g., phase detector 19 in FIG. 1); and when in the retime mode, the local master clock is not adjusted, since the state machine is frozen or locked according to the signal from the mode controller.

In one embodiment, a multiplexer is used to select one of the multiple phase clocks generated from the Delay Locked Loop (DLL) 29 as the local master clock. In another embodiment, a mix of multiplexer and interpolator can be used. The interpolator can be used to interpolate between the phases of clocks generated from the delay chain.

In one embodiment, the state machine 21 is designed to determine how the local master clock is generated from the clocks from the Delay Locked Loop (DLL) 29. The use of the state machine allows the circuitry to generate a local master clock with one clock period less delay when necessary to avoid delay saturation.

Figure 3:
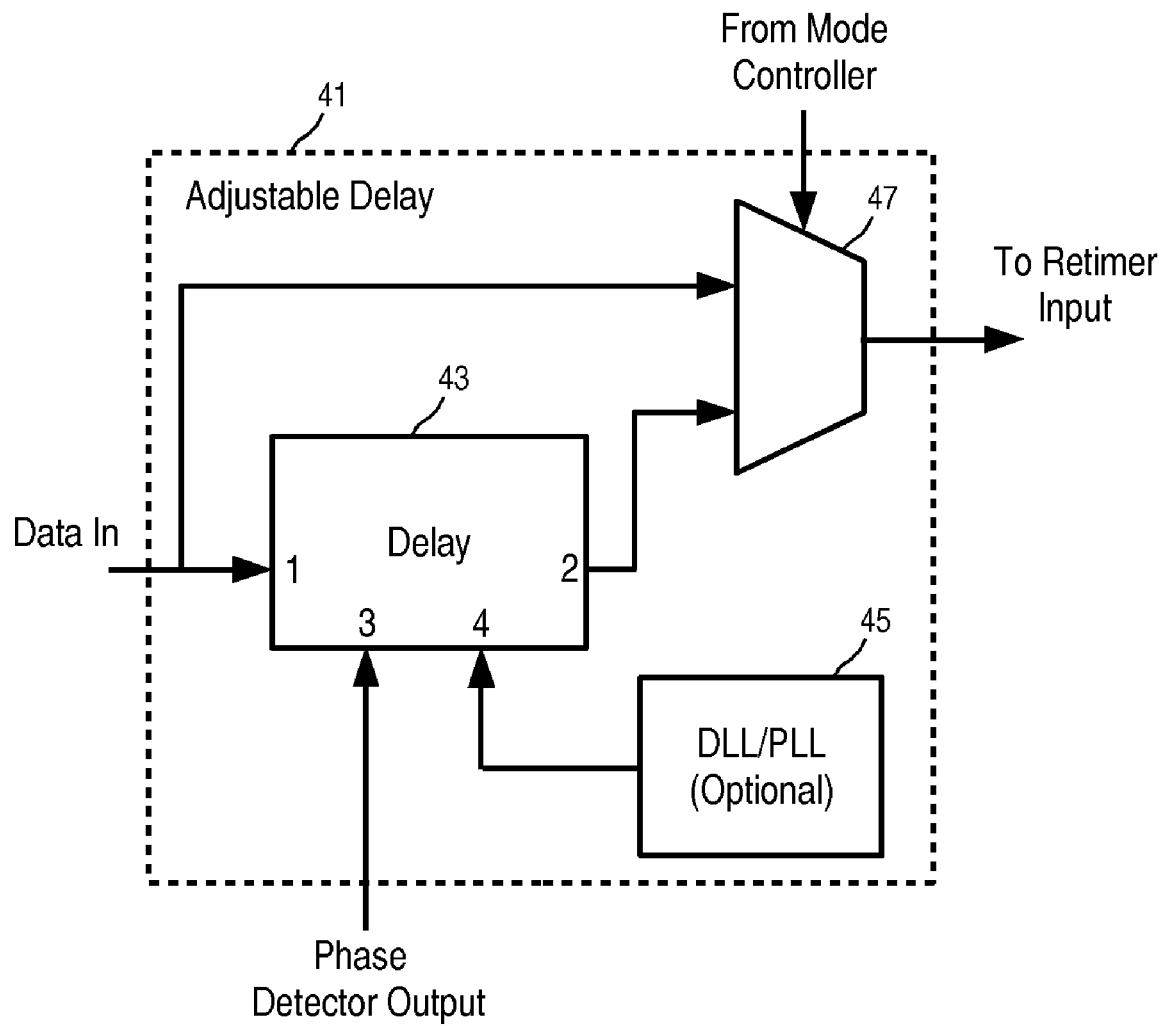
FIG. 3 illustrates an adjustable delay portion of a receiver according to one embodiment of the invention.

FIG. 3 illustrates an adjustable delay portion of a receiver according to one embodiment of the invention. In FIG. 3, an adjustable delay 41 includes a delay 43, a multiplexer 47 and an optional Delay Locked Loop (DLL) or Phase Locked Loop (PLL). The adjustable delay 41 can be used an implementation of adjustable delay 13 in FIG. 1.

In FIG. 3, a multiplexer 47 is used to implement mode control. For example, when in the resync mode, the multiplexer 47 selects the input data that bypasses the delay 43; and when in the retime mode, the multiplexer 47 selects the output of the delay 43, which actively adjusts the delay of the input data according to the output of the phase detector. For example, the phase detector 19 in FIG. 1 can be used to provide the phase detector output. Alternative, a phase detector can be used to compare the phase difference between the local master clock (or other known time base) and the output of the delay 43 (or the output of the multiplexer 47), and to provide the phase detector output.

In FIG. 3, the delay 43 is optionally controlled by a Delay Locked Loop (DLL) or Phase Locked Loop (PLL). In one embodiment, an output of the Delay Locked Look (DLL) 29 in FIG. 2 is used as the output of the DLL/PLL 45. Thus, the adjustable delay 13 and the clock recovery 15 may share a portion of circuitry.

Figure 4:
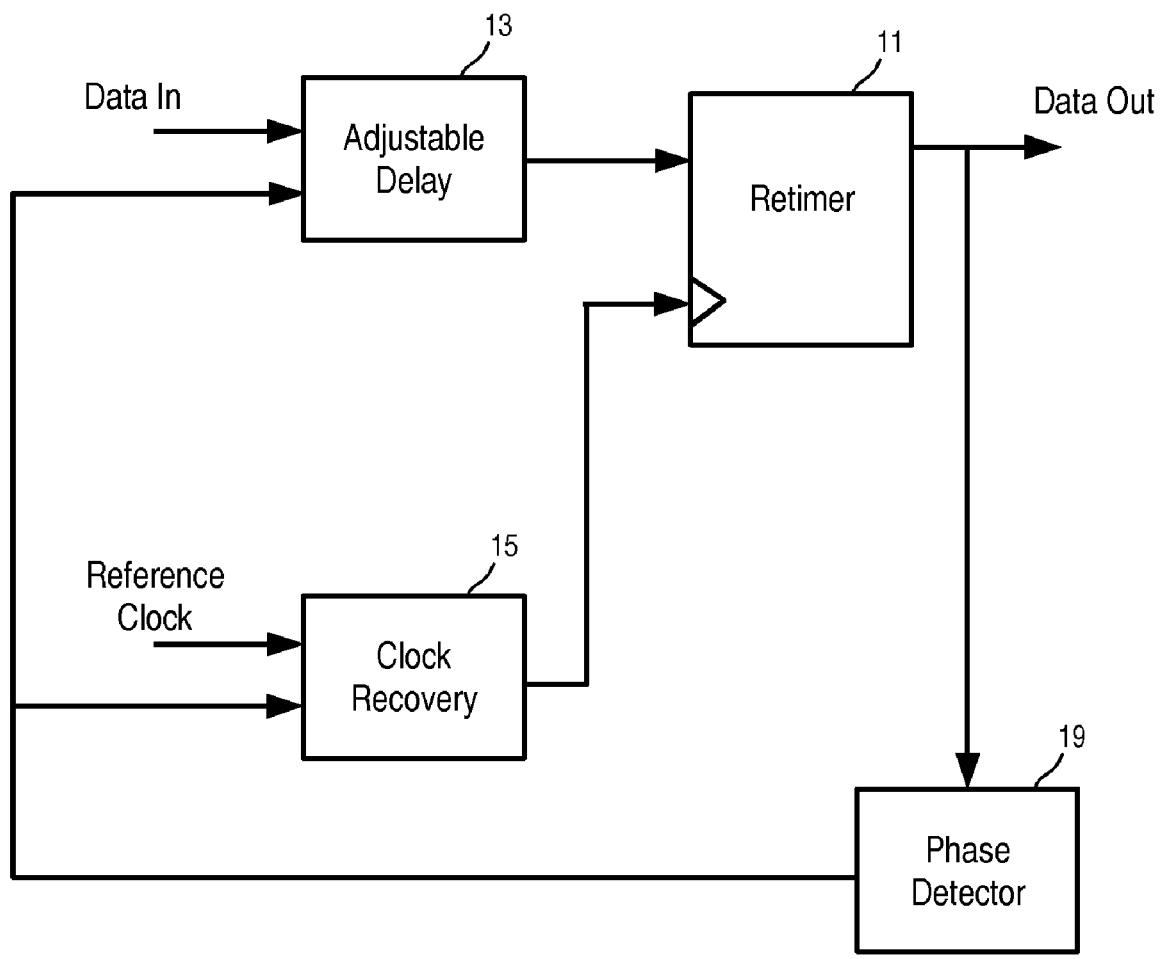
FIG. 4 illustrates another clock and data recovery circuitry according to one embodiment of the invention.

FIG. 4 illustrates another clock and data recovery circuitry according to one embodiment of the invention. In FIG. 4, the adjustable delay 13 and the clock recovery 15 can be both active, according to the input from the phase detector 19. In FIG. 4, the phase detector 19 may generate the same output for the adjustable delay 13 and the clock recovery 15. Alternatively, different outputs may be generated for the adjustable delay 13 and the clock recovery 15. Further, two different types of phase detectors sharing at least a portion of the circuitry can be used to provide different outputs to the adjustable delay 13 and the clock recovery 15.

Figure 5:
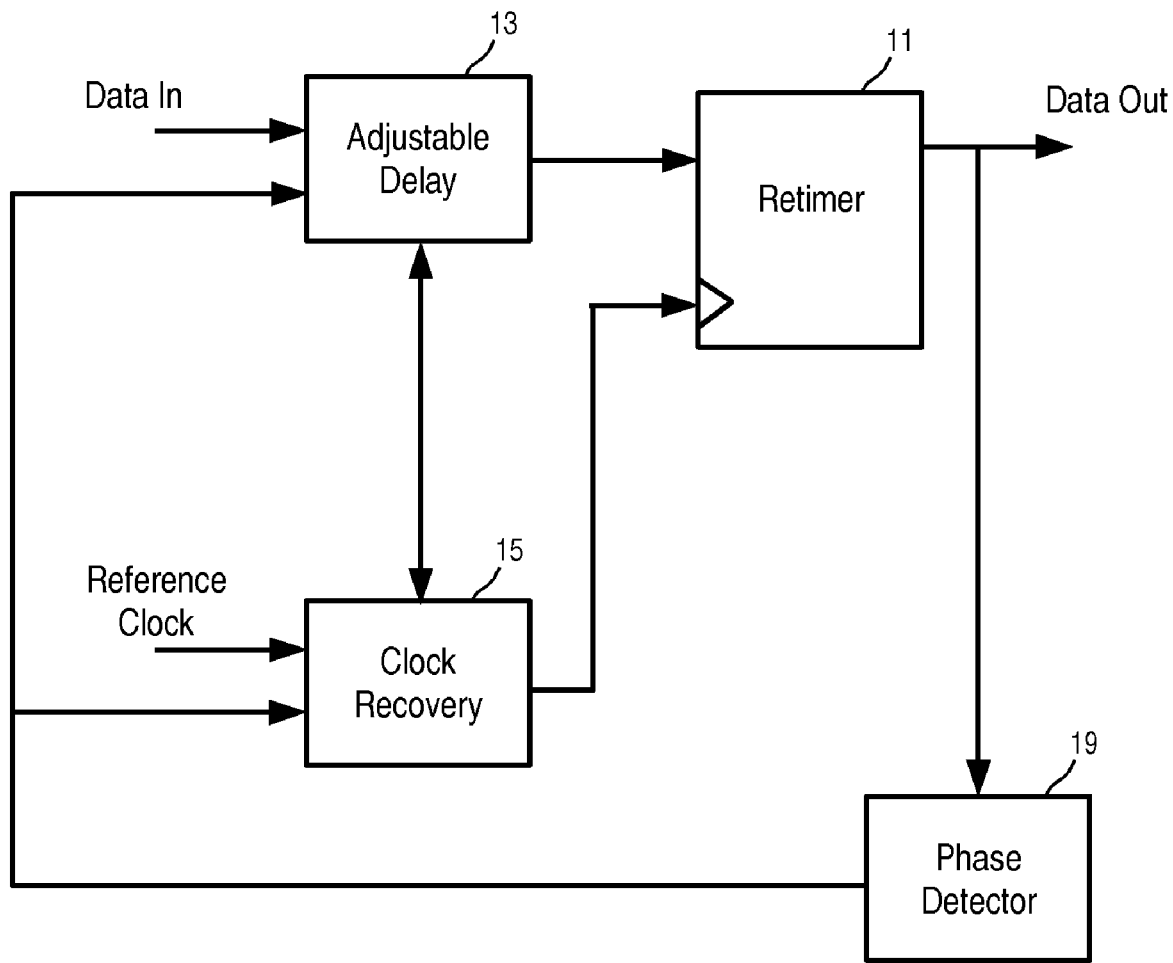
FIG. 5 illustrates a further clock and data recovery circuitry according to one embodiment of the invention.

FIG. 5 illustrates a further clock and data recovery circuitry according to one embodiment of the invention. In FIG. 5, the adjustable delay 13 and the clock recovery 15 communicate with each other for mode control. Thus, the mode control logic can be distributed between the adjustable delay 13 and the clock recovery 15. For example, when it is necessary to adjust the clock, the clock recovery 15 signals the adjustable delay 13 to temporary stop adjusting the delay (or to provide a pre-determined delay, or substantially no delay). After a desirable local master clock is selected/generated, the clock recovery 15 can freeze the local master clock and signal the adjustable delay 13 to actively adjust the delay for the input data.

Figure 6:
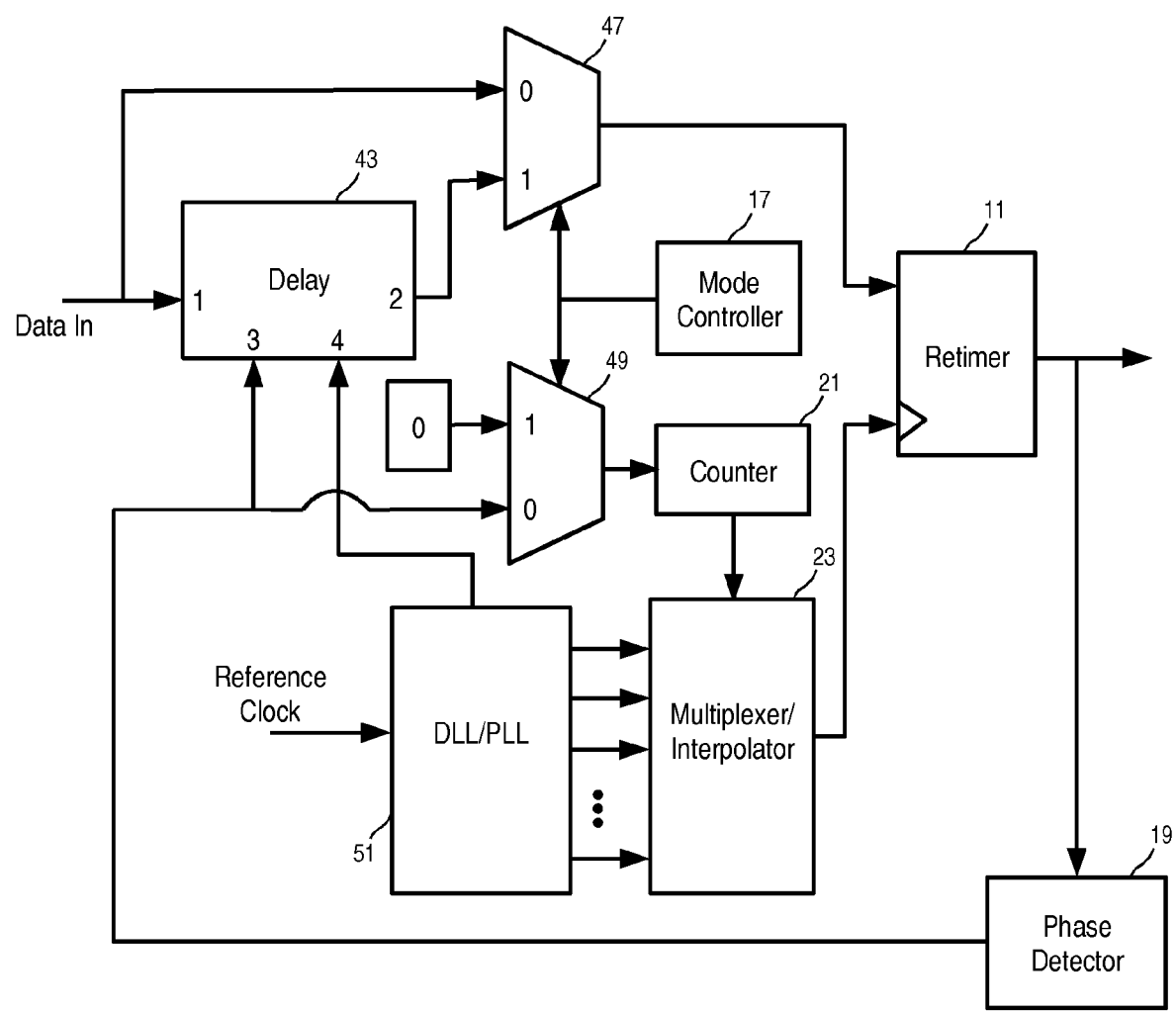
FIG. 6 illustrates an example of a clock and data recovery circuitry according to one embodiment of the invention.

FIG. 6 illustrates an example of a clock and data recovery circuitry according to one embodiment of the invention. In FIG. 6, retimer 11 takes input from the input data or the delayed version of the input data, based on the control signal from the model controller 17 to the multiplexer 47. When the mode controller outputs 0 for the resync mode, the input data bypasses the delay 41 and enters the retimer 11 via the multiplexer 47.

When the mode controller outputs 1 for the retime mode, the delay 43 actively adjusts the delay of the input data to generate a delayed version of the input data, which is selected by the multiplexer 47 as the input for the retimer 11.

When in the retime mode, the delay 43 is actively control by the phase detector 19, which generates a control signal based on the phase of the output of the retimer 11. Alternatively, a phase detector that determines the phase difference between the output of the retimer 11 and the output of the multiplexer/interpolator 23 (e.g., the local master clock) can be used to control the delay 43 when in the retime mode. Alternatively, a phase detector that determines the phase difference between the output of the multiplexer/interpolator 23 (e.g., the local master clock) and the output of the delay 43 (or the output of the multiplexer 47) can be used to control the delay 43 when in the retime mode.

In FIG. 6, a Delay Locked Loop (DLL) or Phase Locked Loop (PLL) 51 is used to generate multiple clocks of different phases (e.g., via a delay chain of the DLL/PLL 51). The multiple clocks of different phases are provided to the multiplexer/interpolator 23 to generate a local master clock for the retimer 11. The multiplexer/interpolator 23 is controlled by the counter 21 to select and/or interpolate the multiple clocks to generate the local master clock.

In FIG. 6, when the mode controller 17 outputs 0 for the resync mode, the multiplexer 49 selects the output of the phase detector 19 as the input to the counter 21. The counter 21 actively controls the selection/interpolation of the clocks to generate the local master clock. When the mode controller 17 outputs 1 for the retime mode, the multiplexer 49 selects zero as the input to the counter 21, effectively freezing or locking the state of the counter 21 and thus locking the local master clock to reduce jitter.

In one embodiment, the phase detector 19 is an Alexander type phase detector when in the resync mode; and the retimer 11 can be implemented using a flip-flop.

The circuitry in FIG. 6 allows for the flexibility of switching between the two CDR loops. This enables synchronizing or re-transmitting the data stream with reduced latency or/and jitter.

For example, during the power up or training sequence, the mode controller can select the mode 0 to cause the counter 21 to select the right clock phase for the data retiming. After the selection of the local master clock, the mode controller can select the mode 1 to cause the state of the counter 21 to be frozen/locked. Thus, the local master clock is locked; and the circuit is in the retime mode with low jitter. Through such an arrangement, the range of the delay 43 for the input data can be greatly reduced. By switching between the two modes, both good jitter performance and lower latency during normal operations can be achieved.

Thus, at least one embodiment of the invention provides the flexibility to choose between a low jitter mode (e.g., a retime mode) and a low latency mode (e.g. a resync mode). Such flexibility can be realized with a simple structure. By switching between the retime mode and the resync mode, data can be synchronized or re-transmitted with simultaneously reduced latency and jitter. Further, the performance in terms of jitter transfer can be greatly improved without sacrificing jitter tolerance.

In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A circuit, comprising:
   a retimer;
   a clock recovery circuit to provide a clock signal to the retimer; and
   an adjustable delay to provide a delayed version of an input signal to the retimer;
   wherein when in a first mode,
   the adjustable delay causes a pre-selected delay in the input signal and
   the clock recovery circuit dynamically selects a clock phase to generate the clock signal.

2. The circuit of claim 1, wherein when in a second mode, the adjustable delay dynamically adjusts the delayed version of the input signal and
   the clock recovery circuit outputs the clock signal having a pre-selected clock phase.

3. The circuit of claim 2, further comprising:
   a control circuit coupled to the clock recovery circuit and the adjustable delay to switch between the first mode and the second mode.

4. The circuit of claim 3, wherein when the control circuit provides a signal to switch from the first mode to the second mode, a current clock phase in the first mode is selected as the pre-selected clock phase in the second mode.

5. The circuit of claim 4, wherein when the control circuit provides a signal to switch from the second mode to the first mode, a pre-determined constant delay is selected as the pre-selected delay in the first mode.

6. The circuit of claim 4, wherein when the control circuit provides a signal to switch from the second mode to the first mode, a current delay in the second mode is selected as the pre-selected delay in the first mode.

7. The circuit of claim 3, further comprising:
   a phase detector coupled to an output of the retimer;
   wherein the clock recovery circuit and an adjustable delay receive an output of the phase detector as input.

8. The circuit of claim 7, wherein the phase detector comprises an Alexander phase detector.

9. The circuit of claim 7, wherein the clock recovery circuit comprises:
   a loop to generate multiple clocks from a reference clock;
   a state machine coupled to the phase detector to determine a control signal from the output of the phase detector; and
   a multiplexer coupled to the state machine and the loop to select the clock signal from the multiple clock according to control signal.

10. The circuit of claim 9, wherein the loop comprises a phase lock loop or a delay look loop.

11. The circuit of claim 7, wherein the clock recovery circuit comprises:
    a loop to generate multiple clocks from a reference clock;
    a state machine coupled to the phase detector to determine a control signal from the output of the phase detector; and
    an interpolator coupled to the state machine and the loop to generate the clock signal from the multiple clock according to control signal.

12. The circuit of claim 11, wherein when switching to the second mode, the state machine is switched to maintain a current state regardless of the output of the phase detector.

13. The circuit of claim 11, wherein the adjustable delay is further controlled according to an output of the loop.

14. The circuit of claim 1, wherein the retimer comprises a flip-flop.

15. A circuit having a first mode and a second mode, the circuit comprising:
    a retimer;
    a clock recovery circuit to provide a clock signal to the retimer, wherein when in the first mode a phase of the clock signal is adjusted according to an output of the retimer and when switching from the first mode to the second mode a current phase of the clock signal determined in the first mode is maintained and not changed in the second mode; and
    an adjustable delay to provide a delayed version of an input signal to the retimer.

16. The circuit of claim 15, wherein when in the second mode, the adjustable delay is adjusted according to the output of the retimer; and when in the first mode, the adjustable delay is not adjusted according to the output of the retimer.

17. The circuit of claim 16, further comprising:
    a phase detector coupled to the clock recovery circuit and the adjustable delay;
    wherein the clock recovery circuit is at least controlled by an output of the phase detector in the second mode; and the adjustable delay is at least controlled by the output of the phase detector in the first mode.

18. A circuit, comprising:
    a mode control to provide a first control signal for a first mode and a second signal for a second mode;
    a retimer;
    a phase detector coupled to an output of the retimer;
    a clock recovery circuit coupled to the mode control to provide a clock signal to the retimer, wherein when in the first mode the clock signal is adjusted according to an output of the phase detector and when in the second mode the clock signal is not adjusted;

an adjustable delay to generate a delayed version of an input signal; and a multiplexer coupled to the mode control to provide the delay version of the input signal to the retimer in the second mode and provide the input signal to the retimer in the first mode.

19. The circuit of claim 18, wherein the clock recovery circuit comprises:

a locked loop comprising a delay chain to generate multiple clocks from a reference clock;

a multiplexer coupled to the mode control;

a counter coupled to multiplexer to generate a control signal from the output of the phase detector in the first mode and maintain the control signal in the second mode; and a circuit coupled to the counter and the loop to output the clock signal based on the multiple clock according to control signal from the counter.

* * * * *